United States Patent
Hsu et al.

(10) Patent No.: US 7,919,782 B2
(45) Date of Patent: Apr. 5, 2011

(54) BONDING STRUCTURE OF CIRCUIT SUBSTRATE AND INSTANT CIRCUIT INSPECTION METHOD THEREOF

(75) Inventors: Ming-Tan Hsu, Padeh (TW); I-Cheng Shih, Padeh (TW)

(73) Assignee: Chunghwa Picture Tubes, Ltd., Padeh, Taoyuan (TW)

( * ) Notice: Subject to any disclaimer, the term of this patent is extended or adjusted under 35 U.S.C. 154(b) by 165 days.

(21) Appl. No.: 11/905,439

(22) Filed: Oct. 1, 2007

(65) Prior Publication Data
US 2008/0149947 A1 Jun. 26, 2008

(30) Foreign Application Priority Data

Dec. 22, 2006 (TW) .............................. 95148472 A

(51) Int. Cl.
*H01L 29/20* (2006.01)
(52) U.S. Cl. .......................................... 257/89; 349/152
(58) Field of Classification Search ..................... 257/89; 349/152
See application file for complete search history.

(56) References Cited

U.S. PATENT DOCUMENTS

| | | | |
|---|---|---|---|
| 5,903,056 A | 5/1999 | Canning et al. | |
| 6,533,549 B1 | 3/2003 | Schreiber et al. | |
| 6,633,361 B1 | 10/2003 | Fujita | |
| 7,224,424 B2 * | 5/2007 | Hwang et al. | 349/152 |
| 7,411,211 B1 * | 8/2008 | Yamazaki | 257/59 |
| 2005/0127936 A1 | 6/2005 | Chen | |

FOREIGN PATENT DOCUMENTS

JP 2001305857 11/2001

* cited by examiner

*Primary Examiner* — Thanh V Pham
*Assistant Examiner* — Caleb Henry
(74) *Attorney, Agent, or Firm* — Winston Hsu; Scott Margo

(57) ABSTRACT

The present invention provides a bonding structure of circuit substrates and an instant circuit inspection method thereof. The contact pad design of the bonding structure has an instant inspection ability of circuit connection in bonding two circuit substrates. In two bonded circuit substrates, the signal inputted at the circuit part passes the conductive particles to the first contact pad, and then passes the conductive particles again to the detecting part from the first contact pad. Therefore, measuring the output signal can inspect the reliability of the circuit connection of the bonded circuit substrates. If the output signal is the same as the input signal, the bonding structure between the first contact pad and the circuit part is validated, or, if not, the bonding structure is invalidated.

3 Claims, 6 Drawing Sheets

BONDING STRUCTURE OF CIRCUIT SUBSTRATE AND INSTANT CIRCUIT INSPECTION METHOD THEREOF

1. FIELD OF THE INVENTION

This invention relates to a bonding structure of two circuit substrates, and, more especially, to a bonding structure with instant inspection for reliability of circuit connection in bonding two circuit substrates.

2. BACKGROUND OF THE RELATED ART

FIG. 1 is a top schematic diagram showing the bonding structure between two circuit substrates according to a prior art. When two circuit substrates 10, 50 are bonded, two circuits on the two circuit substrates 10, 50 are electrically connected to each other via contact pads 11 and 21 at the bonded interface between these two circuit substrates 10 and 50. Especially, in assembling the display panel, such as the liquid crystal display (LCD), the organic electro-luminescence display (OELD) and the plasma display panel (PDP), the surface mount technique (SMT), tape automated bonding (TAB), chip on glass (COG) and chip on film (COF), the aforementioned technique are generally employed.

FIG. 2 illustrates the conduction principle of the circuits on circuit substrates 10 and 50. The circuit on the circuit substrate 10 is covered by an insulating layer 41 and the end of the circuit is exposed to form the contact pad 11. The contact pad 21 on the circuit substrate 50 is electrically connected to the circuit of the circuit substrate 10 via an anisotropic conductive film (ACF) 30. The anisotropic conductive film 30 includes an insulator 31 and a plurality of conductive particles 32 distributed in the insulator 31, and the conductive particles 32 are disposed of an insulating film on their surfaces. The anisotropic conductive film 30 is disposed between two contact pads 11, 21 and thermally compressed as the circuit substrates 10 and 50 are bonded. The insulating film is destroyed to conduct two circuits of these two circuit substrates via the contact pads 11, 21.

In the prior art of TAB and COF, the material of the circuit substrate, which carries the integrated circuit (IC), is transparent, it assures the reliability of the circuit connection to observe whether the contact pads are matched and the conductive particles between the contact pads are deformed or not. But this technique cannot be applied to an opaque circuit substrate.

In a prior art, as shown in FIG. 3 and FIG. 4, a contact pad 130 on a circuit substrate has a chink 131 at the center. In assembling the two circuit substrates, the chink 131 is covered by the contact pad 210 as shown in FIG. 3 if the contact pads 130, 210 are matched well, which indicates an validated circuit connection; and the chink 131 is pervious to light as shown in FIG. 4 if the contact pads 130, 210 are mismatched, which indicates a bad circuit connection. This prior art does not provide an instant method of inspecting the reliability of the circuit connection.

FIG. 5 is a schematic diagram showing another prior art, the dummy pads 140 and a window 141 are formed on two bonded circuit substrates respectively. The condition of matching the window 141 and the dummy pads 140 indicates the reliability of circuit connection of two bonded circuit substrates. But, this technique does not provide the instant inspection.

FIG. 6 is a schematic diagram showing the prior art, there are contact pads 210, 150 on two circuit substrates, wherein the contact pad 150 has sidewalls on its both edges to form the bonding pads 151. When the contact pads 210, 150 are thermally compressed, the amount of the conductive particles 32, constrained between the bonding pads 151, of the anisotropic conductive film is enough to avoid the conductive particles 32 spilling to damage the conduction. Again, this prior art does not provide the instant inspection.

The quality of contact-pad connection affects the reliability of the circuit connection of two bonded circuit substrates, and the main two factors are whether the contact pads are matched or not and contact quality of the anisotropic conductive film. The post-fabricated inspection is a big drawback in assembling two circuit boards. More especially, in assembling the LCD, it costs and spends much to measure white/black dots on the screen of the LCD for inspecting the reliability of the circuit connection after the LCD is assembled. An instant method of inspecting circuit connection in bonding two circuit substrates is essential for providing developers information and condition to modify the environmental parameters to enhance the reliability of the circuit connection.

SUMMARY OF THE INVENTION

For solving the aforementioned problems, one object of this invention provides a contact pad design of a bonding structure having an instant inspection ability of circuit connection in bonding two circuit substrates.

Another object of this invention provides an instant method of inspecting the reliability of circuit connection in bonding two circuit substrates.

To achieve the above-mentioned objects, one embodiment of the present invention is to provide a bonding structure to bond two substrates, especially applied to assemble the circuit substrate of the liquid crystal display and the circuit substrate carrying the driving integrated circuit. The bonding structure includes a first circuit substrate having a first circuit, wherein the end portion of the first circuit comprises a plurality of first contact pads transmitting signals separate from each other, a second circuit substrate having a second circuit, wherein the end portion of the second circuit comprises a plurality of second contact pads transmitting the signals separate from each other and each second contact pad is configured to be opposite to the corresponding first contact pad for connecting the first circuit and is divided into a detecting part and a circuit part separated from each other, and an anisotropic conductive film disposed between each corresponding first and second contact pads for connecting the first contact pad with the circuit part and the detecting part respectively. The anisotropic conductive film includes conductive particles and an insulator, wherein the conductive particles are disposed of an insulation film on their surfaces to remain insulation and distributed in the insulator.

According to one embodiment, the method of inspecting the circuit connection of the aforementioned bonding structure of two circuit substrates comprises: inputting a signal into the circuit part, measuring an output signal from the detecting part and comparing the signal inputted with the output signal, wherein the output signal and the signal inputted are of the same type.

In two bonded circuit substrates, the signal inputted at the circuit part passes the conductive particles to the first contact pad, and then passes the conductive particles again to the detecting part from the first contact pad. Therefore, measuring the output signal can inspect the reliability of the circuit connection of the bonded circuit substrates.

If the output signal is the same as the input signal, the bonding structure between the first contact pad and the circuit part is validated, or, if not, the bonding structure is invalidated.

DETAILED DESCRIPTION OF THE INVENTION

Figure 1:
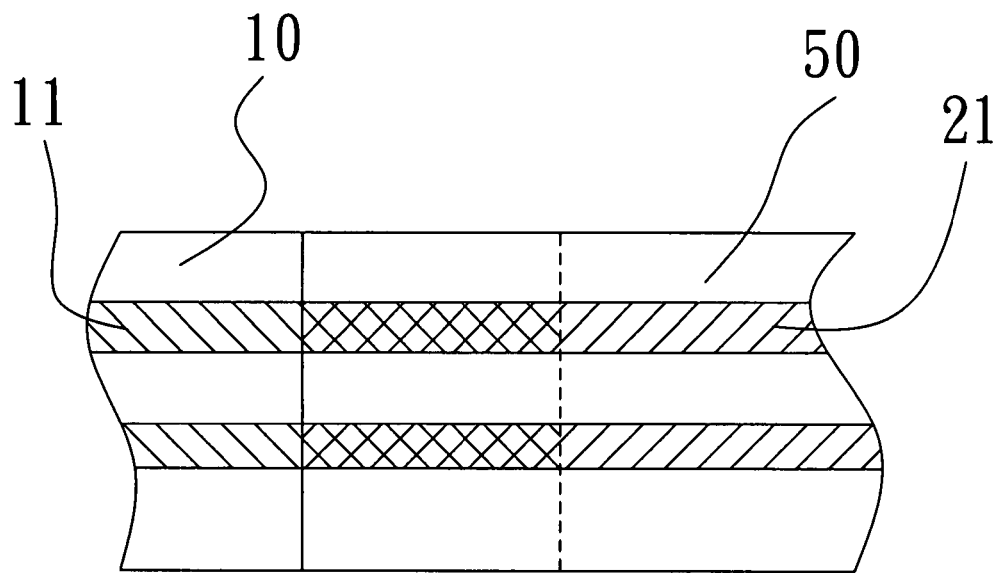
FIG. 1 is the top schematic drawing showing the bonding structure between two circuit substrates.
Figure 2:
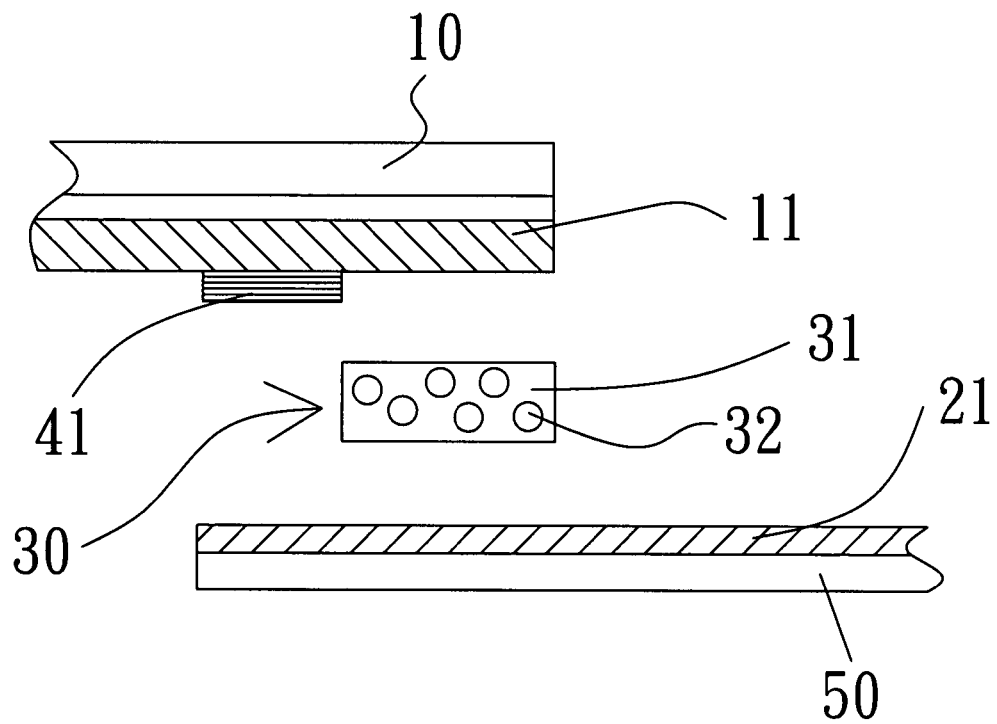
FIG. 2 is the explored sectional drawing showing the bonding structure between two circuit substrates.
Figure 3:
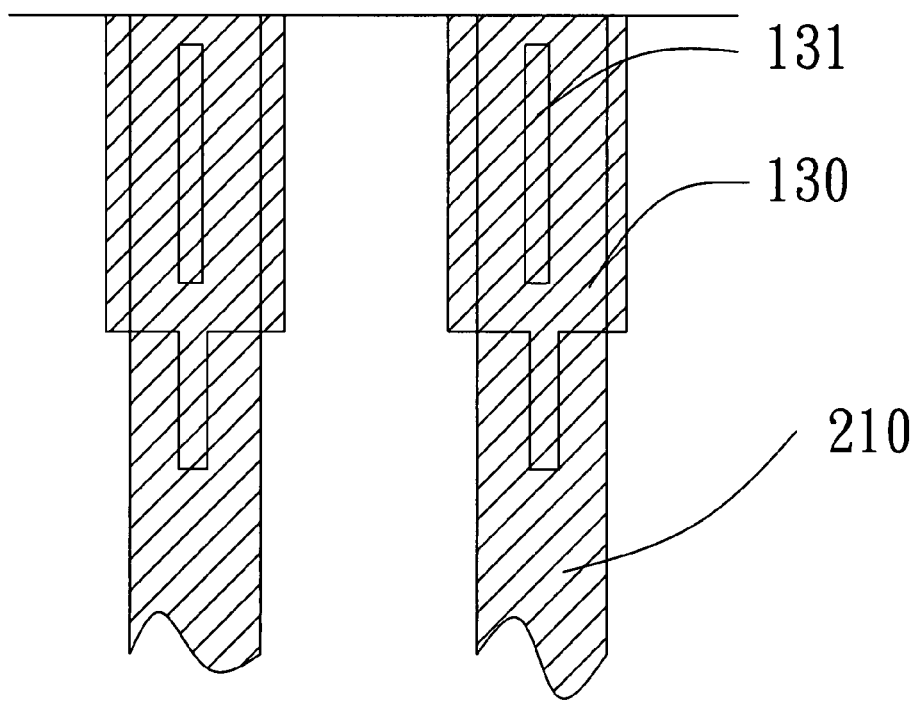
FIG. 3 is the schematic drawing showing the matched state of the bonding structure between two circuit substrates.
Figure 4:
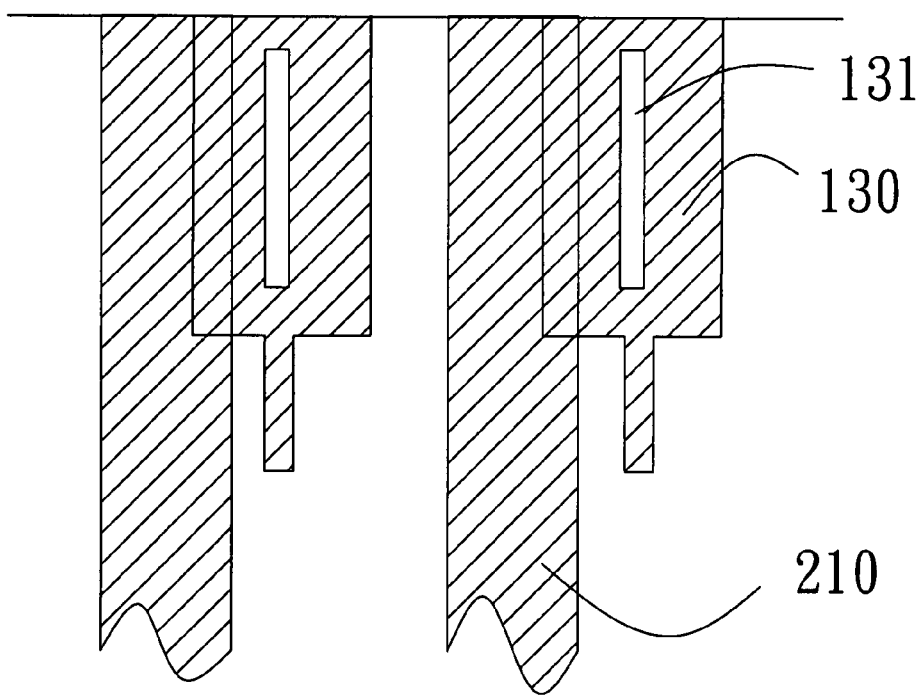
FIG. 4 is the schematic drawing showing the mismatched state of the bonding structure between two circuit substrates.
Figures 5, 6:
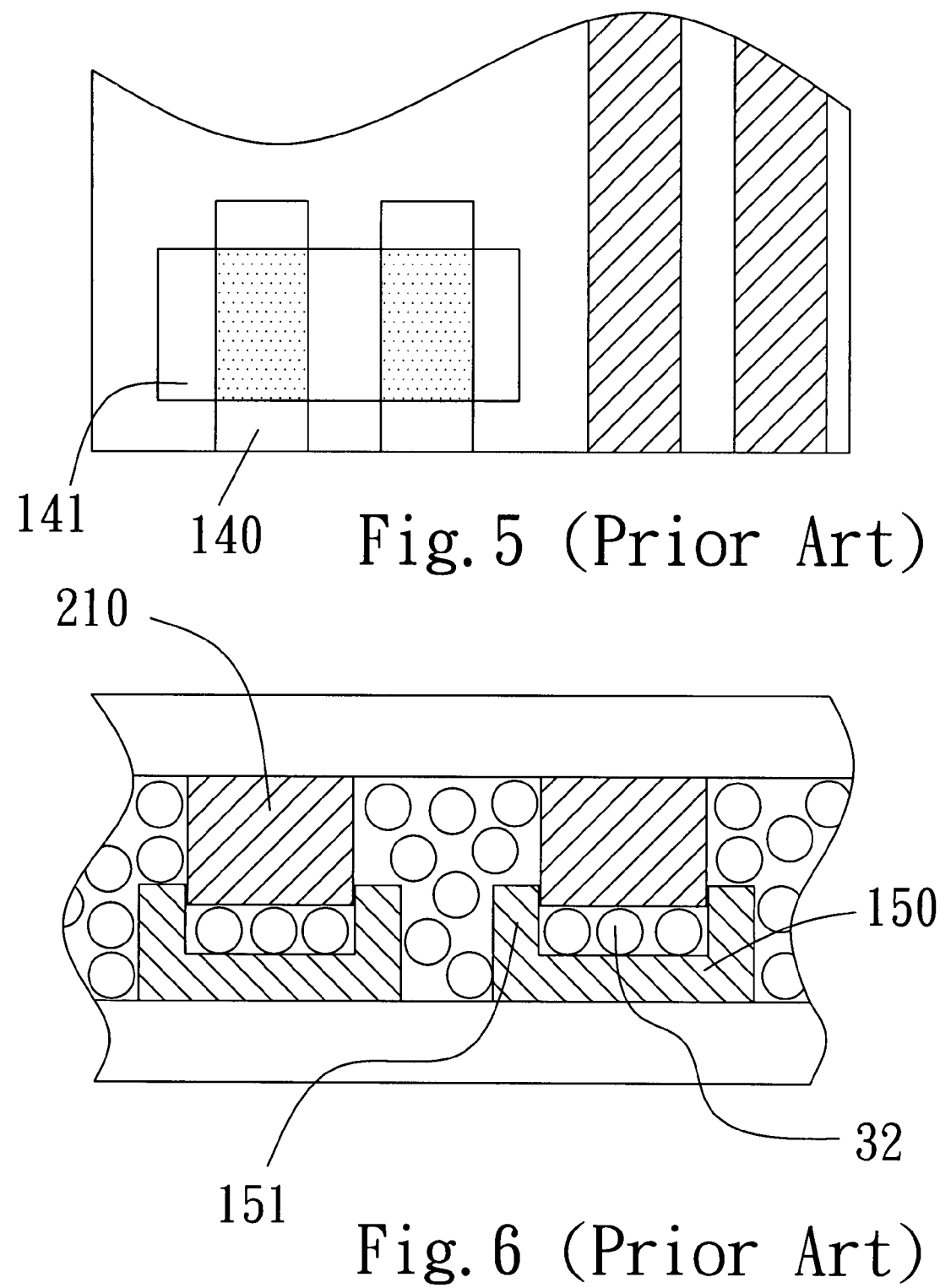
FIG. 5 is the schematic drawing showing the matched state of the bonding structure between two circuit substrates.
FIG. 6 is the sectional drawing showing the bonding structure in two bonded circuit substrates.
Figure 7:
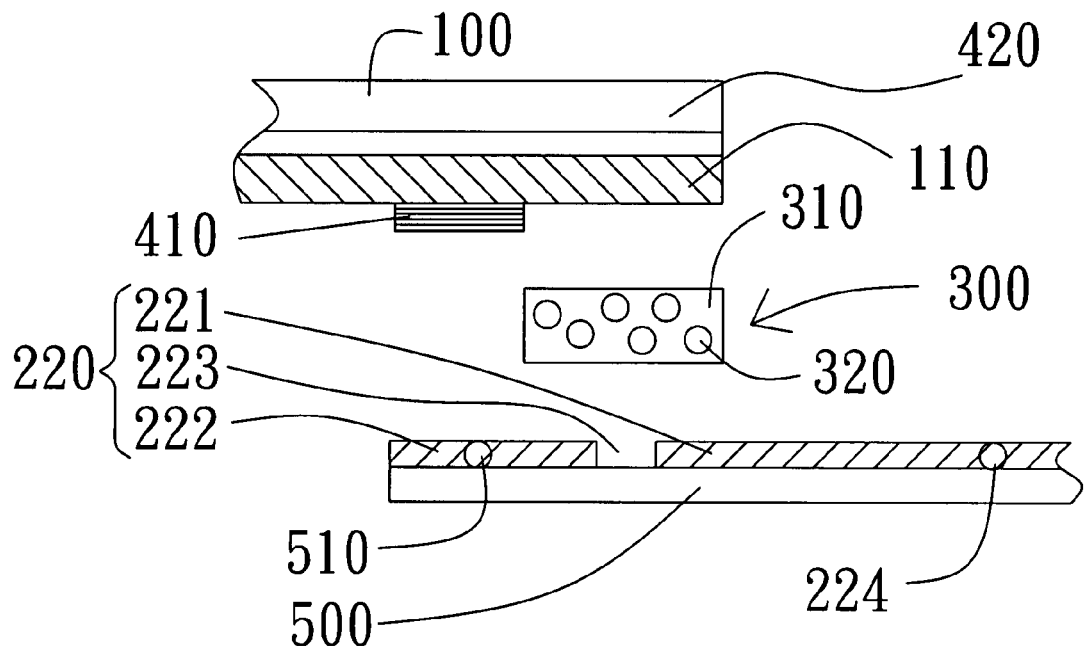
FIG. 7 is the explored sectional drawing showing the bonding structure between two circuit substrates according to an embodiment of this invention.
Figure 7A:
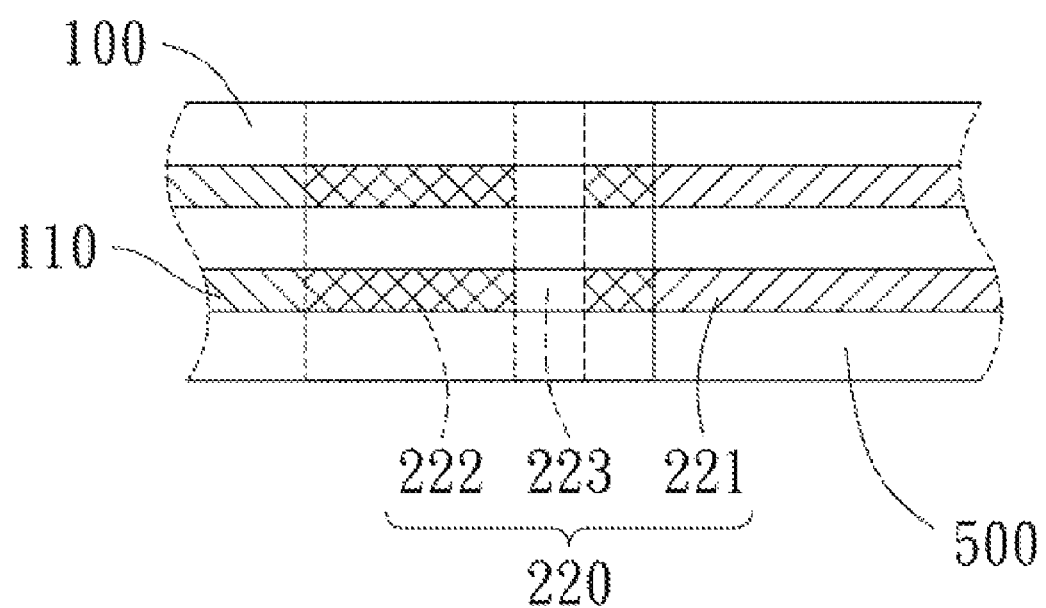
FIG. 7a is the top schematic drawing showing the bonding structure between two substates according to an embodiment of this invention.

FIG. 7a is a top schematic drawing showing the bonding structure between two circuit substrates according to an embodiment, and FIG. 7 is an explored sectional diagram taken along the longitudinal direction of the first contact pad 110 and second contact pad 220 in FIG. 7a. As shown in FIG. 7a and FIG. 7, a first circuit substrate 100 includes an alignment film 420, a first circuit covered by the alignment film 420 (not shown in the figure) and an insulating layer 410, where the end portion of the first circuit comprises a plurality of first contact pads 110 transmitting signals separate from each other, is exposed out of the insulating layer 410. A second circuit substrate 500 includes a second circuit (not shown in the figure) and an end portion thereof comprisies a plurality of second contact pads 220 transmitting the signal separate from each other. Each second contact pad 220 is configured to be opposite to the corresponding first contact pad 110. By a gap 223, each second contact pad 220 is divided into a circuit part 221 and a detecting part 222.

An anisotropic conductive film 300 is disposed between each corresponding first contact pad 110 and second contact pad 220. The anisotropic conductive film 300 includes an insulator 310 and a plurality of conductive particles 320. Wherein, conductive particles 320 are distributed in the insulator 310 and each conductive particle 320 is disposed of an insulation film on its surface to form an insulated particle. Once the anisotropic conductive film 300 is thermally compressed, the insulation surface of the conductive particle 320 is destroyed so as to conduct the first contact pad 110 and the circuit part 221, and to conduct the first contact pad 110 and the detecting part 222.

The circuit part 221 is provided with a signal-inputted area 224 and the detecting part 222 is provided with a detecting area 510. When the circuit part 221 and the detecting part 222 are an open circuit, the signal inputted at the signal-inputted area 224 may not be transferred or measured at the detecting area 510. In order to confirm that the signal from the circuit part 221 does pass through the first contact pad 110 to the detecting part 222, the gap 223 should be wider than the diameter of the conduct particle 320 in the anisotropic conductive film 300.

Figure 8:
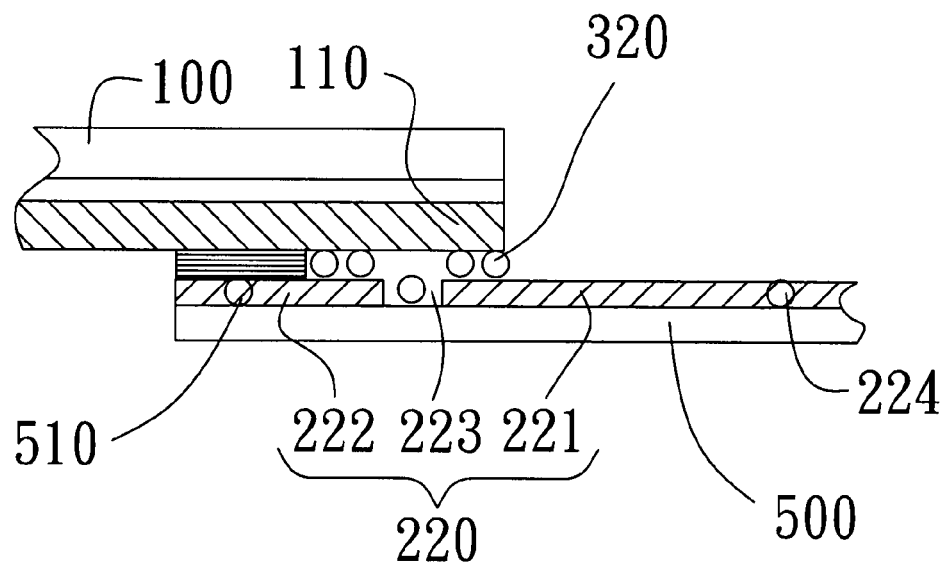
FIG. 8 is the sectional drawing showing the bonding structure between two bonded circuit substrates according to an embodiment of this invention.

Referring to FIG. 7 and FIG. 8 for illustrating the conduction principle of the circuit. When the first circuit substrate 100 and the second circuit substrate 500 are thermally compressed, the insulation surfaces of the conductive particles 320 are destroyed to conduct the first contact pad 110 and the circuit part 221, and to conduct the first contact pad 110 and detecting part 222. However, the conductive particles 320 distributed in the gap 223 are not destroyed to remain insulation because of the diameter smaller than the gap 223. Thus, the circuit part 221 is electrically connected to the first contact pad 110 via the conductive particles 320, and the detecting part 222 is electrically connected to the first contact pad 110 via the conductive particles 320. Therefore, the circuit connection of these two circuit substrates 100, 500 can be validated by measuring the signal inputted at the circuit part 221 at the detecting part 222.

Figure 9:
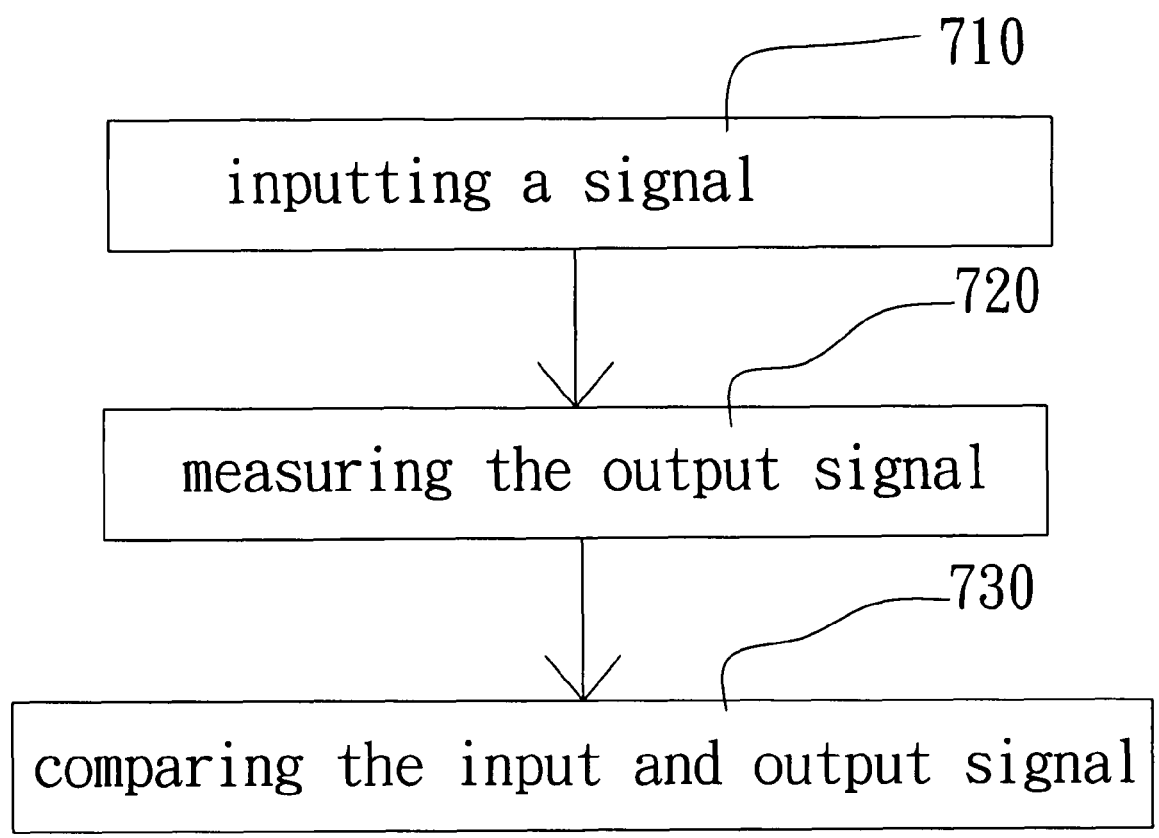
FIG. 9 is the flow chart showing the inspection method according to an embodiment of the present invention.

By accompanying FIG. 8 and FIG. 9, the following explains the instant inspection method:

Step 710 is to input a signal at the circuit part 221 of the second circuit substrate 500.

Step 720 is to measure an output signal at the detecting part 222. The signal is inputted at the circuit part 221 of the second circuit (not shown in the figure) on the second circuit substrate 500, and passes through the conductive particles 320 of the anisotropic conductive film 300 to the first contact pad 110 on the first circuit substrate 100. Then, the signal passes through again the conductive particles 320 of the anisotropic conductive film 300 from the first contact pad 110 to the detecting part 222 on the second circuit substrate 500.

Step 730 is to compare the signal inputted at the circuit part 221 with the output signal at the detecting part 222. If the output signal is the same as the input signal, the bonding structure between the first contact pad 110 and the circuit part 221 is validated, otherwise the bonding structure is failed.

This invention may be employed generally to the bonding structure of the bonded circuit substrates. Wherein, each of the circuit substrates is the insulation circuit substrate, such as the printed circuit board, plastic circuit substrate, glass circuit substrate or flexible circuit substrate, like the tape carrier package substrate, and so on. No matter what the bonded circuit substrates are transparent or not, the bonding structure can be employed to have the instant circuit connection inspection in bonding these circuit substrates to provide a higher reliability than that in the conventional eye-observation method.

For a liquid crystal display, even a flexible panel, the circuit substrate carrying the driving integrated circuit may be implemented as the first circuit substrate. The circuit substrate carrying the array circuit of the LCD may be implemented as the second circuit substrate. Once this invention is applied in bonding the two circuit substrates, the bonding structure of the display has the instant inspecting ability of circuit connection for the bonding structure.

Although the present invention has been explained in relation to its preferred embodiment, it is to be understood that other modifications and variation can be made without departing the spirit and scope of the invention as claimed.

What is claimed is:

1. An instant circuit inspection method, applied to inspect the reliability of a circuit connection of a bonding structure of two circuit substrates, comprising the steps of:

providing the bonding structure comprising:
  a first circuit substrate having a first circuit, wherein an end portion of the first circuit comprises a plurality of first contact pads transmitting signals separate from each other;
  a second circuit substrate having a second circuit, wherein an end portion of the second circuit comprises a plurality of second contact pads transmitting the signals separate from each other and each second contact pad is configured to be opposite to the corresponding first contact pad for connecting the first circuit, and is divided into a circuit part and a detecting part by a gap; and
  an anisotropic conductive film disposed between each corresponding first and second contact pad, wherein the gap is wider than the diameter of the conduct particle in the anisotropic conductive film;
the detecting part is electrically connected to the circuit part by the anisotropic conductive film and the first contact pad; and the single first contact pad is simultaneously electrically connected to the circuit part and the detecting part;
performing inspection procedures to each of the second contact pads, wherein the inspection procedures comprises:
  inputting a signal to the circuit part of the second contact pad;
  measuring an output signal from the detecting part of the second contact pad; and
  comparing the output signal with the signal inputted, wherein the output signal and the signal inputted are of the same type.

2. An instant circuit inspection method according to claim 1, wherein during the step of comparing the output signal with the signal inputted, the bonding structure of two bonded circuit substrates is validated to be electrically connected if the output signal is the same as the signal inputted, otherwise, the bonding structure is invalidated to be electrically connected.

3. An instant circuit inspection method, applied to inspect the reliability of a circuit connection of a bonding structure of two circuit substrates, comprising the steps of:
providing the bonding structure comprising:
  a first circuit substrate having a first circuit, wherein an end portion of the first circuit comprises a plurality of first contact pads transmitting signals separate from each other;
  a second circuit substrate having a second circuit, wherein an end portion of the second circuit comprises a plurality of second contact pads transmitting the signals separate from each other and each second contact pad is configured to be opposite to the corresponding first contact pad for connecting the first circuit, and is divided into a circuit part and a detecting part by a gap; and
  an anisotropic conductive film disposed between each corresponding first and second contact pad, wherein the gap is wider than the diameter of the conduct particle in the anisotropic conductive film; the detecting part is electrically connected to the circuit part by the anisotropic conductive film and the first contact pad; and the single first contact pad is simultaneously electrically connected to the circuit part and the detecting part;
performing inspection procedures to each of the second contact pads, wherein the inspection procedures comprises:
  connecting one end of a signal source to the circuit part of the second contact pads;
  connecting one end of a meter to the detecting part of the second contact pad;
  connecting the other end of the meter to the other end of the signal source;
  inputting a signal to the circuit part;
  measuring an output signal from the detecting part; and
  comparing the output signal with the signal inputted, wherein the output signal and the signal inputted are of the same type.

* * * * *